United States Patent [19]

Hayashi

[11] Patent Number: 5,319,614
[45] Date of Patent: Jun. 7, 1994

[54] TIME INTERVAL MEASURING APPARATUS

[75] Inventor: Mishio Hayashi, Tokyo, Japan

[73] Assignee: Advantest Corporation, Tokyo, Japan

[21] Appl. No.: 106,880

[22] Filed: Aug. 16, 1993

[30] Foreign Application Priority Data

Aug. 14, 1992 [JP] Japan .................. 4-57300[U]

[51] Int. Cl.$^5$ .................. G04F 8/00; G04F 10/00
[52] U.S. Cl. .................................................. 368/113
[58] Field of Search ............... 368/113, 118, 120; 364/569, 575; 377/20

[56] References Cited

U.S. PATENT DOCUMENTS

| | | | |
|---|---|---|---|
| 3,983,481 | 9/1976 | Nutt et al. | 368/118 |
| 4,090,141 | 5/1978 | LeBlanc | 368/113 |
| 4,097,801 | 6/1978 | Freeman et al. | 368/120 |
| 4,164,648 | 8/1979 | Chu | 368/118 |
| 4,613,951 | 9/1986 | Chu | 364/569 |

Primary Examiner—Vit W. Miska
Attorney, Agent, or Firm—Knobbe, Martens, Olson & Bear

[57] ABSTRACT

A time interval measuring apparatus for measuring a time interval between two input signals and a signal period of either one of the input signals is capable of detecting and canceling the time difference in the signal propagation times between the two signal paths which transmit two input signals to be measured to an inner circuit of the time interval measuring apparatus. The true time interval is calculated by using the first time interval measurement result obtained when the first and second switches are switched to the first and second input terminals respectively, and the second time interval measurement result obtained when the second and first switches are switched to the first and second input terminals respectively, and the signal period of the input signal. The difference between the signal propagation times in the two input signal paths is canceled by the calculation part. The true time interval, the signal period and the phase difference between the input signals are displayed on the display.

7 Claims, 5 Drawing Sheets

TIME INTERVAL MEASURING APPARATUS

FIELD OF THE INVENTION

This invention relates to a time interval measuring apparatus which measures the time interval between input signals, and more particularly, to a time interval measuring apparatus which is capable of measuring the time interval between input signals with a high degree of accuracy by canceling the propagation time difference between the signals input in the circuit configuration contained within the measuring apparatus. The time interval measuring apparatus changes the wave shape of input analog signals to square waves and measures the time difference between the two rising edges of the first and second input analog signals or between the rising edge and the falling edge of the single input analog signal.

BACKGROUND OF THE INVENTION

FIG. 4 illustrates an example of a conventional time interval measuring instrument ordinarily used to measure the time interval between input signals. FIG. 5 is the timing diagram of each signal recorded by the conventional time interval measuring instrument of FIG. 4.

The conventional time interval measuring instrument also has the ability to measure the phase difference between input signals. The conventional time interval measuring instrument generally is comprised of a measuring part 21, a calculation part 28, and a display 27. The measuring part 21 is made up of input terminals 11 and 12, capacitors 13 and 14, wave formatters 17 and 18, D-type flip flops 22 and 23, a signal period measuring circuit 24, and a time interval measuring circuit 25. The signal period measuring circuit 24 in the measuring part 21 and the time interval measuring circuit 25 have structures similar to those described in the Japanese Patent Publication No. 63-3272 and Japanese Patent Laying-Open Publication Nos. 62-294993 and 63-191970.

Analog signals S11 and S12 are input to the input terminals 11 and 12, respectively and the DC components of the analog signals S11 and S12 are removed by the capacitors 13 and 14. The analog signals S11 and S12 are then input to the wave formatters 17 and 18, where the threshold voltage is set at 0 V. In the wave formatters 17 and 18, the analog signals S11 and S12 are changed to square waves S21 and S22. The signals S21 and S22, thus formatted to square waves, are input to the measuring part 21 through the input terminals 19 and 20. The signal period P of signal S21 as shown in FIG. 5 (which, in many instances, is the same as the signal period of signal S22) is measured by the signal period measuring circuit 24. Also, the time interval T between the rising edge of signal S21 and the rising edge of signal S22, as shown in FIG. 5, is measured by the time interval measuring circuit 25. The calculation part 28 receives the measured signal period P and time interval T from the measuring part 21 and instructs the display 27 to display the measured information of period P and time interval T. At the same time, the calculation part 28 performs a calculation of the phase difference between the two signals [(T/P)×360 degree], which is also displayed on the display 27.

The above mentioned conventional instrument measures the time interval T between the signals S21 and S22 by assuming that the signal propagation time $\tau1$ from the input terminal 11 to the input terminal 19 and the signal propagation time $\tau2$ from the input terminal 12 to the input terminal 20 are equal. However, in practice, it is difficult to keep the difference between signal propagation times less than 100 pico-seconds because of the differences in accuracy between electric devices (such as the wave formatters 17 and 18). Furthermore, the signal propagation times may be affected by the frequency or amplitude of the input signals, or other conditions such as temperature. Therefore, a disadvantage of the conventional time interval measuring instrument is that highly precise time measurement is not possible, since an instrument requirement is that the propagation times of the two signal paths be equal. Even though the propagation time can be forced to stay equal under certain conditions, it is practically impossible to keep them equal under all conditions.

SUMMARY OF THE INVENTION

Accordingly, the purpose of the invention is to provide a time interval measuring apparatus for measuring the time difference between input signals with a high degree of accuracy without being influenced by the difference and fluctuation of propagation time between the input signals.

The present invention is directed to a time interval measuring apparatus which is capable of measuring time intervals with a high degree of accuracy by canceling the difference between the signal propagation times of the two input signal paths. The time interval measuring apparatus of the present invention comprises:

first and second input terminals which receive first and second analog input signals, respectively;

first and second wave formatters, having similar threshold voltages, which transform the first and second analog signals into square wave forms;

a first switch whose input side can switch over to the first input terminal or the second input terminal and whose output side is connected to the input of the first wave formatter;

a second switch whose input side can switch over to the second input terminal or the first input terminal and whose output side is connected to the input of the second wave formatter;

a measuring part which receives the output signals from the first and second wave formatters and measures the signal period of one of the input signals and the time difference between the two rising edges or between the two falling edges of the first input signal and the second input signal;

a calculation part which calculates the true time interval $Tx = [(T1 - T2 + P)/2]$, wherein P is the measured signal period, T1 is the measured time interval when the first and second switches are connected to the first and second input terminals, respectively, and T2 is the measured time interval when the first and second switches are connected to the second and first input terminals, respectively.

According to the present invention, since the time interval measurement is performed two times, due to switching between the two signal paths, the difference in signal propagation time between the two signal paths can be effectively measured and canceled by the calculation means. Further, when two signal probes are used for picking-up signals to be measured, the propagation time difference between the two signal probes can also be canceled. Therefore, it is possible to measure the time interval between the input signals with a remarkably improved degree of accuracy.

BRIEF DESCRIPTION OF THE DRAWINGS

FIG. 2 (B) is a timing chart which shows the timing relationship between the signals in the first example of this invention, when the switches 15 and 16 are changed-over to the contacts 15-2 and 16-2, respectively.

DETAILED DESCRIPTION OF THE INVENTION

Figure 1:
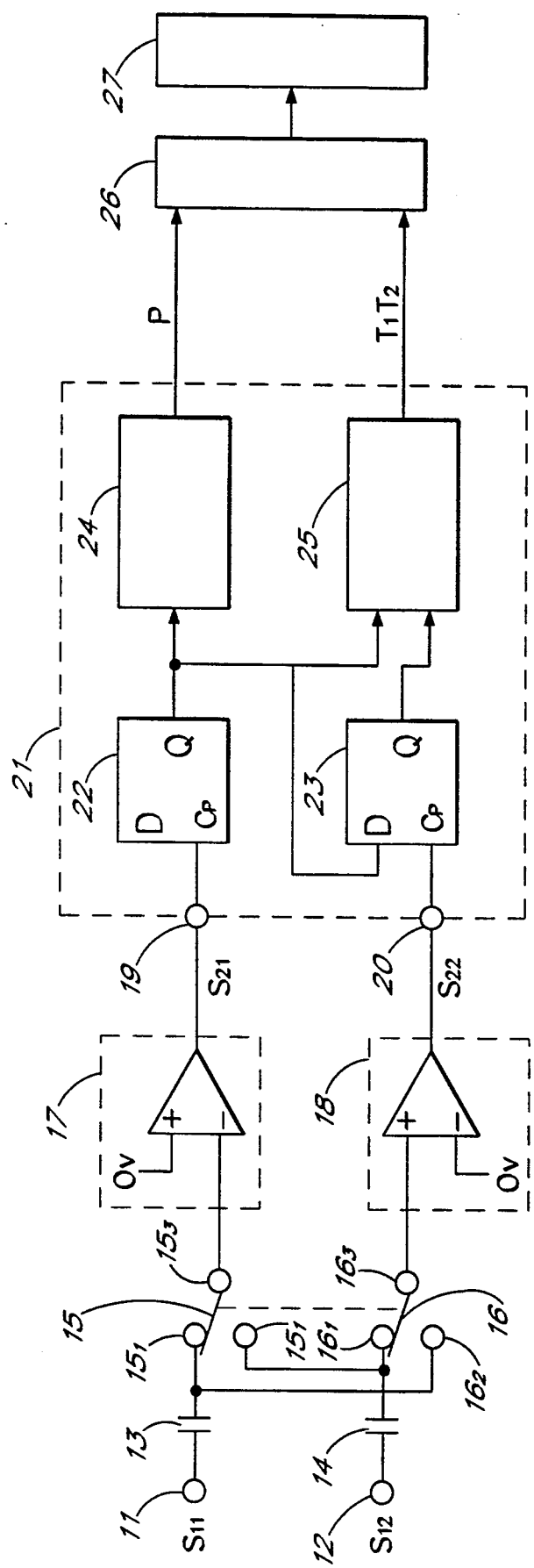
FIG. 1 is a diagram which shows the structure of the first embodiment of the time interval measuring apparatus in accordance with the present invention.

In order to obtain a better understanding of the present invention, the principle theory of operation by which signal propagation time differences are canceled will be discussed. The apparatus, as shown in FIG. 1, which is similar to FIG. 4, comprises a first input terminal and a second input terminal, a first wave formatter and a second wave formatter, and a measuring part. A first switch and a second switch are provided between the input terminals and the wave formatters, respectively. As shown in FIG. 2, the signal propagation time $\tau 1$ is defined as the time required for the first square wave signal to reach the input of the measuring part after the first analog signal has been input to the first input terminal. The signal propagation time $\tau 2$ is defined as the time required for the second square wave signal to reach the input of the measuring part after the second analog signal has been input to the second input terminal.

Figures 2A, 2B:
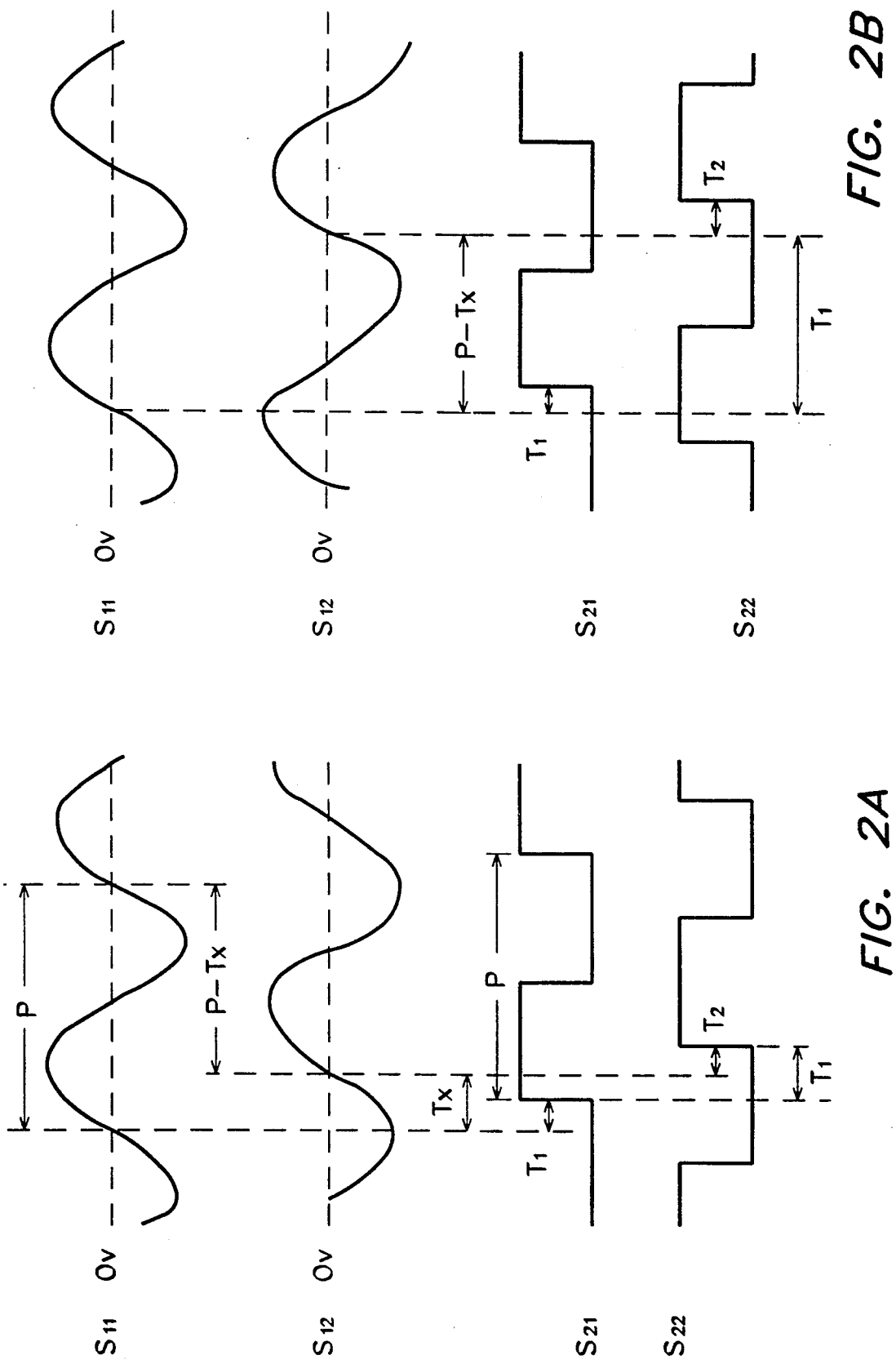
FIG. 2(A) is a timing chart which shows the timing relationship between the signals in the first embodiment of the present invention when the switches 15 and 16 are changed-over to the contacts 15-1 and 16-1, respectively.

When the first and second switches are set to the first and second input terminals, respectively, according to FIG. 2(A), the following relationship is established among the true time interval Tx, the measured time interval T1 and the signal propagation times $\tau 1$ and $\tau 2$:

$$Tx + \tau 2 = \tau 1 + T1 \quad (1)$$

Conversely, when the first and second switches are switched to the first and second input terminals, respectively, according to FIG. 2(B), the following relationship is established among the true time interval Tx, the measured time interval T2, the measured signal period P and the signal propagation times $\tau 1$ and $\tau 2$:

$$P - Tx + \tau 2 = \tau 1 + T2 \quad (2)$$

From Equations (1) and (2), the true time interval Tx becomes:

$$Tx = (T1 - T2 + P)/2 \quad (3)$$

Since the signal propagation times $\tau 1$ and $\tau 2$ are not included in Equation (3), we can obtain the true time interval Tx without being influenced by the signal propagation times $\tau 1$ and $\tau 2$.

With reference to the principle theory of operation as described above, a more detailed description of the structure and operation of the time interval measuring apparatus of the present invention will be given below, with further reference to FIGS. 1 and 2.

FIG. 1 is a first embodiment of the present invention showing the structure of the time interval measuring apparatus. FIG. 2(A) is a timing chart showing the timing relationship between the signals in the time interval measuring apparatus of FIG. 1 when switches 15 and 16 are set to contacts 15-1 and 16-1, respectively. FIG. 2(B) is a timing chart showing the timing relationship between the signals in the time interval measuring apparatus of FIG. 1 when the switches 15 and 16 are switched to contacts 15-2 and 16-2, respectively.

Figure 4:
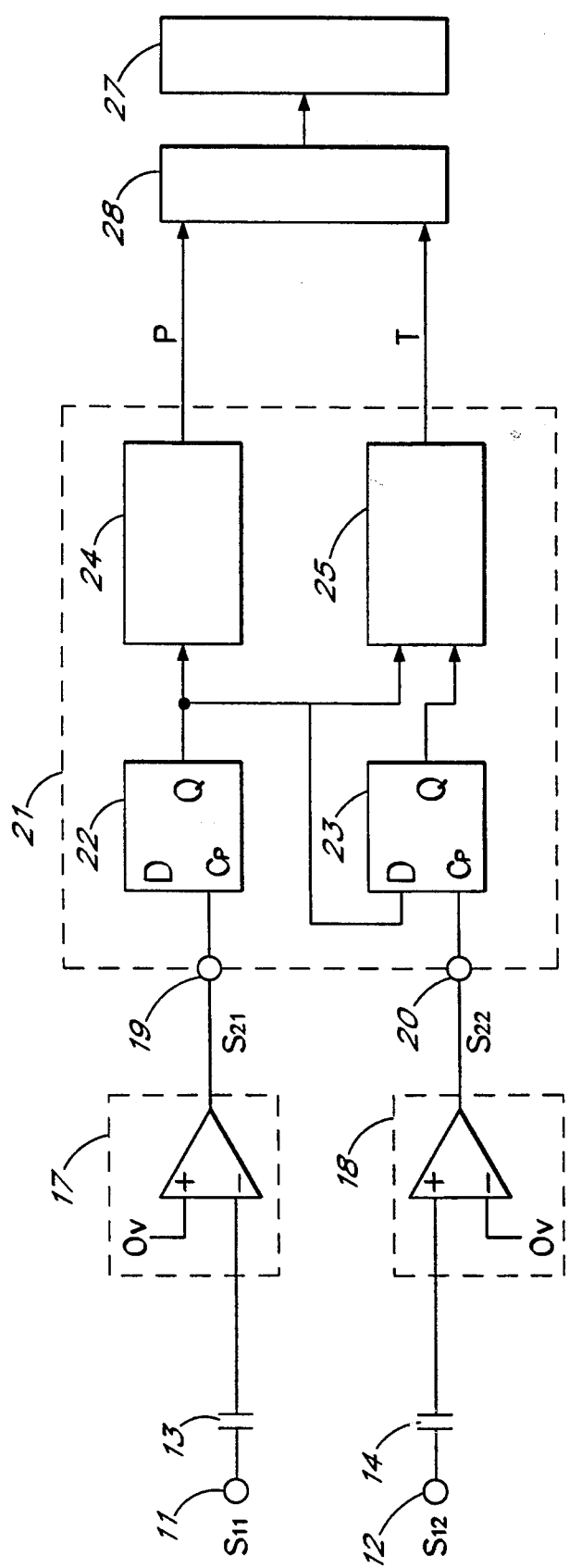
FIG. 4 shows the structure of a conventional time interval measuring apparatus.
Figure 5:
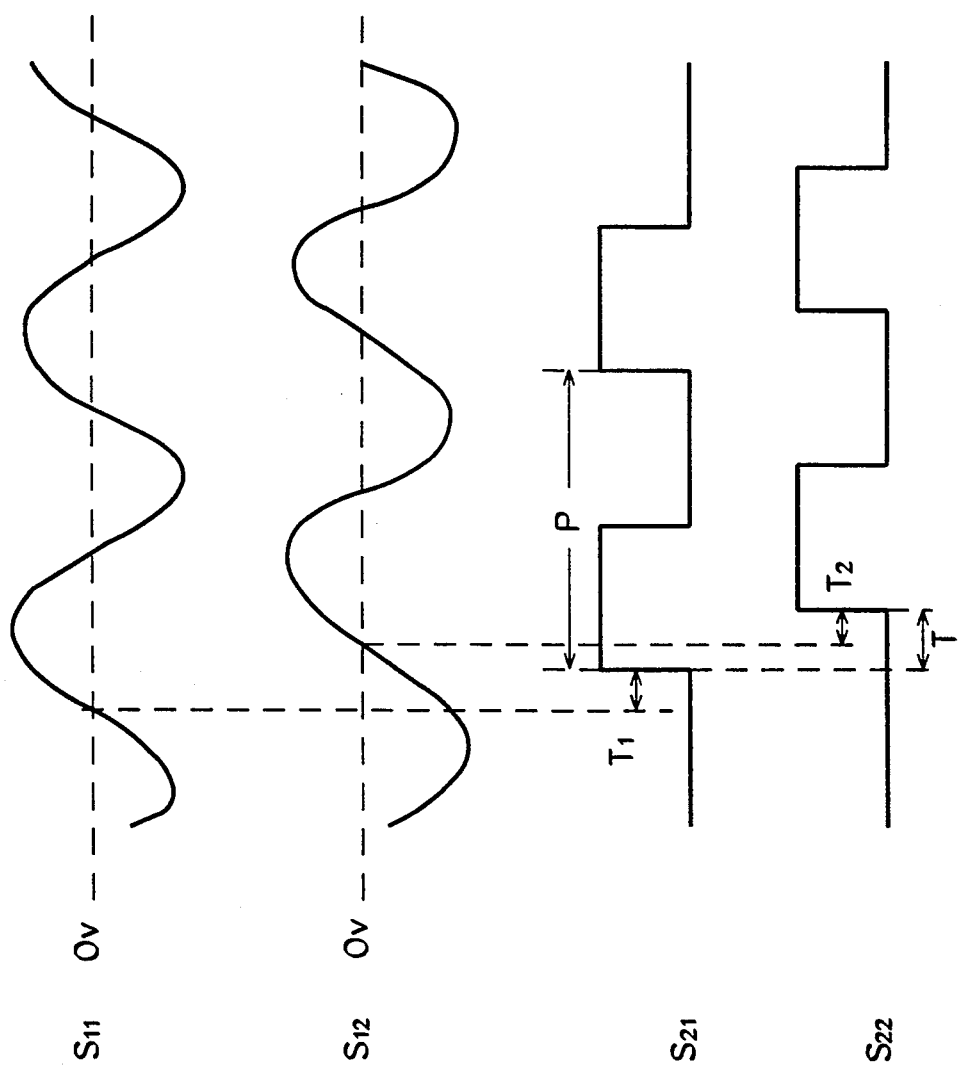
FIG. 5 is a timing chart which shows the timing relationship between the signals recorded by the conventional time interval measuring apparatus of FIG. 4.

The major differences between the conventional time interval measuring instrument, as shown in FIG. 4, and the present invention, as shown in FIG. 1, are as follows. The switch 15 is provided between a capacitor 13 and a wave formatter 17, and the switch 16 is provided between a capacitor 14 and a wave formatter 18. Since a calculation part 26 performs an additional calculation, the actual structure of the calculation part 26 in the present invention is different from a calculation part 28 of FIG. 4. The same circuit configuration of the wave formatter parts 17 and 18 of FIG. 4 can be used in the present invention. However, the circuit configurations for the wave formatters 17 and 18 should be contained in separate integrated circuit packages so as to avoid cross-talk problems.

In FIG. 1, the components which are identical to that of the conventional time interval measuring instrument of FIG. 4 are designated by the same numerals in FIG. 1; subsequently, no further explanation of these components will be given. Switch 15 is comprised of contacts 15-1, 15-2 and an output terminal 15-3. Contact 15-1 is connected to an input terminal 11 through capacitor 13. Contact 15-2 is connected to an input terminal 12 through capacitor 14. The output terminal 15-3 is connected to the input terminal of wave formatter 17. Switch 16 is comprised of contacts 16-1, 16-2 and an output terminal 16-3. Contact 16-1 is connected to the input terminal 12 through capacitor 14. Contact 16-2 is connected to the input terminal 11 through capacitor 13. The output terminal 16-3 is connected to the input terminal of the wave formatter 18.

The following four signal paths are adjusted so that the signal propagation times of the four signal paths are equal.

(a) A signal path from the input terminal 11 to the contact 15-1.

(b) A signal path from the input terminal 11 to the contact 16-2.

(c) A signal path from the input terminal 12 to the contact 15-2.

(d) A signal path from the input terminal 12 to the contact 16-1.

The signal propagation time from the input terminal 11 to an input terminal 19 of a measuring part 21 is designated by $\tau 1$. The signal propagation time from the input terminal 12 to an input terminal 20 of the measuring part 21 is designated by $\tau 2$. The measuring part 21 is calibrated so that it can accurately measure the time difference between the rising edges of a signal at the input terminal 19 and a signal at the input terminal 20. The calculation part 26 receives measured data T1, T2 and P from the measuring part 21. The data T1 is the time difference (interval) between the measured signals at the input terminals 19 and 20 when the switches 15 and 16 are positioned on the contacts 15-1 and 16-1. The data T2 is the time difference (interval) between the measured signals at the input terminals 19 and 20 when the switches 15 and 16 are positioned on the contacts 15-2 and 16-2. The data P is the signal period of the input signal as shown in FIG. 2(A). The calculation part 26 calculates the time difference (the true time interval) as defined in Equation (3) above, i.e., $Tx=(T1-T2+P)/2$, and the phase difference $[(Tx/P)\times 360$ degree], and displays the calculated results on a display 27.

With reference to FIGS. 1 and 2, the following is a description of the operation of the first embodiment of the time interval measuring apparatus, as shown in FIG. 1. The calculation part 26 instructs the switches 15 and 16 to connect to the contacts 15-1 and 16-1, respectively. An analog input signal S11 is applied to the input terminal 11 and an analog input signal S12 is applied to the input terminal 12. The DC components of the analog input signals S11 and S12 are removed by the capacitors 13 and 14. The analog signals are then input to the wave formatters 17 and 18, where the threshold voltage is set at 0 V. Subsequently, the wave shapes of the analog signals are transformed by the wave formatters 17 and 18 into square wave signals S21 and S22 as shown in FIG. 2. The square wave signals S21 and S22 are input to the measuring part 21 through the input terminals 19 and 20, respectively. The time difference (time interval) T1 between the rising edge of the signal S21 and the rising edge of the signal S22 is measured by a time difference measuring circuit 25. The signal period P of the signal S21 is measured by a period measuring circuit 24.

Next, the calculation part 26 instructs the switches 15 and 16 to connect to the contacts 15-2 and 16-2, respectively. The time difference measuring circuit 25 in the measuring part 21 measures the time difference (time interval) T2 between the square wave signals S21 and S22, i.e., the time difference between the rising edge of the signal S21 and the rising edge of the signal S22. Then the calculation part 26 performs the calculation as illustrated in the aforementioned Equation (3) from the measured time intervals T1 and T2 and the signal period P to obtain the true time interval Tx. The calculation part 26 instructs the display 27 to display the true time interval Tx and the signal period P. The calculation part 26 also calculates the phase difference between the two input signals, i.e., $(Tx/P)\times 360$ degree $=(T1-T2+P)\times 180/P$, by utilizing the measured data of the signal period P and time differences T1 and T2 from the measuring part 21.

The present invention can accomplish the time interval measurement without being influenced by the signal propagation times $\tau 1$ and $\tau 2$, which are the main causes of measurement errors. Therefore, the signal propagation times $\tau 1$ and $\tau 2$, the major portion of which result from the amount of time required to transform the signals by the wave formatters 17 and 18, do not affect the final outcome of the time interval measurement. Therefore, the accuracy of the time interval measurement in the present invention is determined by the differences in the signal propagation times in the aforementioned four signal paths (1)-(4). These signal paths are formed by passive circuit elements and it is easy to keep the differences of each signal propagation time less than 50 picoseconds. Therefore, the present invention can measure the time difference with greater accuracy and ease than the conventional time interval measuring instrument.

Additionally, when formulas (1) and (2) are combined, the following relationship is obtained.

$$\tau 1-\tau 2=(P-T1-T2)/2 \quad (4)$$

According to this Equation, by measuring the signal period P and the time intervals T1 and T2 with respect to an input signal (not necessarily a known signal), the difference of signal propagation times $\tau 1-\tau 2$ can be calculated. If the measured signal period P and the time intervals T1 and T2 are replaced with a signal period P0 and time intervals T01 and T02, the aforementioned formula (4) becomes:

$$\tau 1-\tau 2=(P0-T01-T02)/2 \quad (5)$$

If the above formula is substituted into formula (1), the following relationship can be obtained.

$$Tx=T1+(P0-T01-T02)/2 \quad (6)$$

Thus, if the difference of signal propagation times (i.e. $\tau 1-\tau 2=(P0-T01-T02)/2$) is calculated in advance, the true time difference Tx can be directly obtained by measuring the time interval T1, which makes the time measurement much simpler.

In the foregoing, the steps required to measure the time interval between the rising edge of one signal and the rising edge of the other signal has been discussed. Additionally, the measurement of the time interval between a rising edge of one signal and a falling edge of the other signal can be accomplished by inserting an inverter, which inverts polarity of incoming signals, after either one of the wave formatters 17 or 18.

Figure 3:
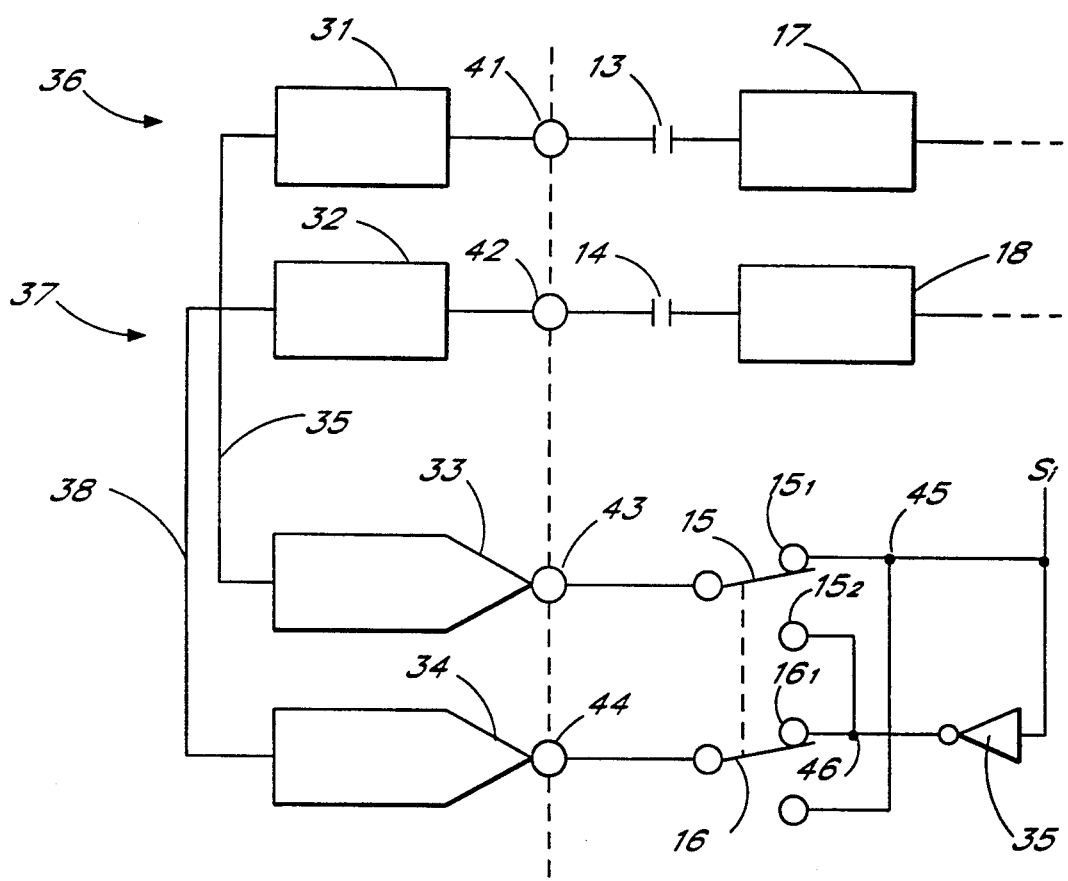
FIG. 3 is a diagram which shows principal components of the second embodiment of time interval measuring apparatus in accordance with the present invention.

With reference to FIG. 3, which shows a second embodiment of the present invention, the following is an explanation regarding the steps required to measure the time interval of input signals utilizing a signal probe. In many instances, it is preferable to measure an electric signal in an electric circuit using a signal probe, since the probe can pick-up the signal without affecting the operation of the electric circuit. FIG. 3 shows the principal components of the time interval measurement apparatus in accordance with the present invention wherein the propagation time difference between the two probes can be canceled. More particularly, FIG. 3 illustrate the structure for calibrating the time interval measuring apparatus of the present invention by measuring the propagation time difference between the two probes and the wave formatters 17 and 18. A probe 36 is composed of a probe interior circuit 31, cable 35 and a hook 33. A probe 37 is composed of a probe interior circuit 32, a cable 38 and a hook 34. Each tip of the hooks 33 and 34 is electric conductive to pick-up signals and is arranged to hook the probe to the desired location on the electric circuit where the measurement will take place. The probe interior circuits 31 and 32 are connected to connecting points 41 and 42, respectively, which are typically input terminals of the time interval measuring apparatus of the present invention. The hooks 33 and 34 are connected to the switches 15 and 16, respectively. The connecting points 41 and 42 are connected to the wave formatters 17 and 18, respectively, through capacitors 13 and 14. An input signal source, (not shown) which outputs the signal Si to be measured, is connected to a connecting point 45 and an inverter 35. Preferably, an internal clock signal of the time interval measuring apparatus should be used as the input signal Si, however, any signals which have sufficient phase stability can also be used. The inverter 35 is connected to a connecting point 46. This inverter is employed for providing a certain delay time for the input signal Si supplied to the connecting point 46. Thus, a delay circuit or any other components that can delay a signal can be replaced with the inverter 35. Similar to the example used in reference to FIG. 1, signal propagation times in the following four signal paths are adjusted to be equal to each other.

(a') A signal path from the connecting point 45 to a connecting point 43 through the contact 15-1 of switch 15.

(b') A signal path from the connecting point 45 to a connecting point 44 through the contact 16-2 of switch 16

(c') A signal path from the connecting point 46 to the connecting point 43 through the contact 15-2 of switch 15.

(d') A signal path from the connecting point 46 to the connecting point 44 through the contact 16-1 of switch 16.

Pursuant to the same calculation procedure as mentioned above with reference to formulas (5) and (6), the difference of signal propagation times ($\tau1'-\tau2'$) at the input terminals of the measuring part 21 (which includes the signal propagation time difference between the wave formatters 17 and 18, as well as the signal propagation time difference between the probes 36 and 37 at the connecting points 41 and 42) can be calculated by the calculation part 26 of FIG. 1. After the calibration, the hooks 33 and 34 are disconnected from the connecting points 43 and 44, and then, connected to an electric circuit to pick-up signals to measure a time interval Tx according to formula (6). Therefore, the true time interval Tx can be measured through the probes 36 and 37.

As previously discussed, the present invention enables one to obtain highly accurate time interval measurements without being affected by the difference of signal propagation times in the time interval measuring apparatus or the probes attached to the time interval measuring apparatus used to measure the pick-up signals. The true time interval is calculated by using the first time interval measurement result, obtained when the first and second switches are switched to the first and second input terminals, respectively, and the second time interval measurement result, obtained when the second and first switches are switched to the first and second input terminals, respectively, and the signal period of the input signal. The difference between the signal propagation times in the two input signal paths is canceled by the calculation part. The true time interval, the signal period and the phase difference between the input signals are displayed on the display.

What is claimed is:

1. A time interval measuring apparatus for measuring a time interval between two input signals and a signal period of one of the input signals, comprising:

first and second input terminals which respectively receive first and second input signals, first and second wave formatters having the same threshold voltages with each other for changing the first and second input signals into square wave forms, a first switch whose input side can be switched to either the first input terminal or the second input terminal and whose output side is connected to an input of the first wave formatter, a second switch whose input side can be switched to either the second input terminal or the first input terminal and whose output side is connected to an input of the second wave formatter, a measuring part which receives the output signals from the first and second wave formatters and measures the time interval which is defined as the time difference between the two rising edges or between the two falling edges of the first input signal and the second input signal and the signal period of one of the input signals, a calculation part which calculates a true time interval $Tx=[(T1-T2+P)/2]$, wherein P is a measured signal period, T1 is a measured time interval when the first and second switches are respectively connected to the first and second input terminals respectively and T2 is a measured time interval when the first and second switches are respectively connected to the second and first input terminals.

2. A time interval measuring apparatus as defined in claim 1, characterized in that the difference in signal propagation times between a first signal path which extends from the input terminal to a first input of the measuring part and a second signal path which extends from the second input terminal to a second input of the measuring part is canceled by the calculation part.

3. A time interval measuring apparatus as defined in Claim 1, characterized in that a pair of signal probes for picking-up electric signals from an electric circuit are connected between the first and second switches and the first and second input terminals, the difference of signal propagation time between the pair of signal probes being canceled by the calculation part.

4. A time interval measuring apparatus as defined in claim 1, characterized in that a true time interval Tx of input signals is calculated by $Tx=T1+(P0-T01-T02)/2$, wherein T1 is a measured time interval for present input signals, P0 is a measured signal period for the previous input signals, T01 is a measured time interval for the previous input signals when the first and second switches are respectively connected to the first and second input terminals and T02 is a measured time interval for the previous input signals when the first and second switches are respectively connected to the second and first input terminals.

5. A time interval measuring apparatus as defined in claim 1, characterized in that a phase difference $\phi$ between the first and second input signals is calculated by $\phi=[(Tx/P)\times 360 \text{ degree}]$ by the calculation part.

6. A time interval measuring apparatus as defined in claim 5, characterized in that the true time interval Tx, the signal period P and the phase difference $\phi$ are displayed on a display means.

7. A method of measuring a time interval of input signals by a time interval measuring apparatus which can measure a time interval and a signal period of two signals for obtaining a true time interval measurement data which is not affected by the difference of propagation times between two input signal channels, said method comprising the following steps of:

supplying a first input signal to be measured to a first input terminal of the time interval measuring apparatus, and a second input signal to a second input terminal of the time interval measuring apparatus, wave shaping the first and second input signals so that the first and second input signals are converted to corresponding square wave forms, measuring the time interval T1 and a signal period P of the first and second input signals which have been wave shaped, switching the input signals for supplying the first input signal to the second input terminal of the time interval measuring apparatus, and the second input signal to the first input terminal of the time interval measuring apparatus, wave shaping the first and second input signals so that the first and second input signals are converted to corresponding square wave forms, measuring the time interval T2 of the first and second input signals which have been wave shaped, calculating the true time interval $Tx=[(T1-T2+P)/2]$ and displaying the result on a display surface.

* * * * *